United States Patent
Lehtinen et al.

[11] Patent Number: 5,675,611
[45] Date of Patent: Oct. 7, 1997

[54] OUTPUT POWER CONTROL AND ENVELOPE SHAPING FOR A PULSED TRANSMITTER

[75] Inventors: Kari T. Lehtinen; Jouko Hakkanen, both of Salo, Finland

[73] Assignee: Nokia Mobile Phones Ltd., Salo, Finland

[21] Appl. No.: 486,718

[22] Filed: Jun. 7, 1995

[30] Foreign Application Priority Data

Jun. 15, 1994 [FI] Finland ................... 942839

[51] Int. Cl.$^6$ ........................ H03C 1/62
[52] U.S. Cl. ............ 375/297; 375/312; 330/2; 330/51; 330/135; 332/159; 455/93; 455/108; 455/126; 455/127
[58] Field of Search ............... 375/300, 295, 375/296, 297, 312, 268; 332/149, 157, 158, 159, 160, 162; 455/33.1, 31.1, 33.2, 33.4, 34.1, 34.2, 63, 108, 126, 127.93; 330/85, 149, 51, 135, 2

[56] References Cited

U.S. PATENT DOCUMENTS

| | | | |
|---|---|---|---|
| 5,038,112 | 8/1991 | O'Neill | 330/207 P |
| 5,049,832 | 9/1991 | Cavers | 330/149 |
| 5,091,919 | 2/1992 | Kuisma | 375/297 |
| 5,123,031 | 6/1992 | Kuisma | 375/296 |
| 5,291,147 | 3/1994 | Muurinen | 330/136 |
| 5,291,150 | 3/1994 | Saarnimo et al. | 330/279 |
| 5,303,268 | 4/1994 | Tsutsumi et al. | 375/296 |
| 5,392,464 | 2/1995 | Pakonen | 455/115 |
| 5,404,585 | 4/1995 | Vimpari et al. | 455/115 |
| 5,432,473 | 7/1995 | Mattila et al. | 330/133 |
| 5,434,537 | 7/1995 | Kukkonen | 330/2 |
| 5,450,620 | 9/1995 | Vaisanen | 455/127 |
| 5,491,832 | 2/1996 | Malkamaki et al. | 455/33.1 |
| 5,493,255 | 2/1996 | Murtojarvi | 330/296 |
| 5,530,923 | 6/1996 | Heinonen et al. | 455/126 |
| 5,548,616 | 8/1996 | Mucke et al. | 375/295 |

OTHER PUBLICATIONS

Finnish Office Action and English translation thereof dated 24 Mar. 1995 for Finnish Priority Document NO. 942839.

*Primary Examiner*—Wellington Chin
*Assistant Examiner*—William Luther
*Attorney, Agent, or Firm*—Perman & Green, LLP

[57] ABSTRACT

Some mobile station cellular networks use either amplitude modulation or constant envelope modulation depending on the situation. The pulsed transmitter of the mobile station is switched on and off by a first control signal (TXP) and the output power envelope shaping of the pulse to be transmitted is controlled in the feedback loop by a second control signal (TXC). According to the invention the output power is controlled by a third control signal (TXCE) which in the amplitude modulation case switches off the feedback loop for the period of the information transfer and which at other times closes the feedback loop.

12 Claims, 2 Drawing Sheets

OUTPUT POWER CONTROL AND ENVELOPE SHAPING FOR A PULSED TRANSMITTER

BACKGROUND OF THE INVENTION

1. Field of the Invention

The invention relates to the output power control of a pulsed transmitter.

2. Description of the Related Art

As the density of mobile phones grows, methods for Increasing the capacity of mobile networks are continuously under development. Systems have been designed in cellular networks, for instance, in which different modulation schemes are used in the cells of the network. One such application has been designed for TDMA mobile communication systems which use a constant envelope modulation scheme, for instance the GMSK-scheme in the GSM network, in large macrocells and a Qam-type modulation scheme in microcells (picocells). When the mobile station then moves between different cells, a change of the modulation scheme must be carried out in the traffic, possibly Including changes in the sampling rate and the length of the transmission power switching on period.

It is no problem to use the transmitter power control circuit when a constant envelope modulation is used because in this case there is no output power variation of the transmitter due to the information content of the transmission. On the contrary, when using the amplitude modulation it seems to be unreasonable to use the power control because the information to be transmitted causes output power variations of the transmitter as such: in this case the power control would cancel the variation caused by the information and the system would not function in the desired way any longer. However, the power control is clearly needed with respect to the increase and decrease periods of power, i.e., during the ramp up and down period, to smoothen the transient peaks which would otherwise violate spectrum requirements. One solution to this problem would be to switch the power control loop off after the ramp up and then on again before the ramp down. However, if we use a constant envelope modulation we must not switch the power control loop off because we then loose the possibility to cancel the output power variation due to, e.g. temperature and supply voltage changes. Moreover, using the power control loop In the constant envelope modulation attenuates the possible amplitude variation of the modulator output and, consequently, makes it easier to meet the amplitude modulation/phase modulation (AM/PM) conversion requirements of the power amplifier. This allows the amplifier to be made more nonlinear and, accordingly, makes its performance more efficient.

SUMMARY OF THE INVENTION

In accordance with one aspect of the Invention there is provided a method for output power control of a pulsed radio transmitter in a radio device, wherein either amplitude modulation or constant envelope modulation is used for transferring information on the basis of a control signal obtained from the base station of the radio network, the transmission of pulse in the device being switched on and off by a first control signal, the output power envelope shaping of the pulse to be transmitted being controlled in a feedback loop by a second control signal, and a third control signal being arranged in the radio device, which in the amplitude modulation case switches off the feedback loop for the period of information transfer and which at Other times closes the feedback loop.

In accordance with a second aspect of the invention there is provided a method for output power control of a pulsed radio transmitter in a radio device, wherein either amplitude modulation or constant envelope modulation is used for transferring information on the basis of a control signal obtained from the base station of the radio network, the transmission of pulse in the device being switched on and off by a first control signal, the output power ramp up and down of the pulse to be transmitted being controlled in a feedback loop by a second control signal and a third control signal being arranged in the radio device, which in the amplitude modulation case transmits a modulated signal (Mod) as the second control signal of the feedback loop for the period of information transfer, and which at other times transmits a pulse, which shapes the transmission pulse power envelope, as the second control signal of the feedback loop.

The present invention provides a solution to the conflict regarding the power control requirements when two modulation schemes are used in the same device.

In accordance with the invention the pulsed transmitter can be used applying both constant envelope modulation and amplitude modulation.

In accordance with the inventive idea, in the case of constant envelope modulation, the output of the transmitter can be continuously controlled by a control loop. In the case of amplitude modulation, the output is controlled by the control loop during power ramp up and down, but the control loop is not working during the period the information is transferred.

In accordance with a third aspect of the invention there is provided an output power control for a burst radio transmitter operable in a first mode in which there is no output power variation due to the information content of the transmission and a second mode in which the information content of the transmission causes output power variations, comprising a feedback loop for shaping the envelope of bursts during operation in the first mode and means operable to inhibit shaping during operation in the second mode.

Other advantageous versions of the invention are illustrated in the dependent Claims.

BRIEF DESCRIPTION OF THE DRAWINGS

The invention is described in the following in more detail with reference to the appended Claims. The figures illustrate schematically the power control and the high frequency parts of the transmitter.

DETAILED DESCRIPTION OF THE INVENTION

Figure 1:
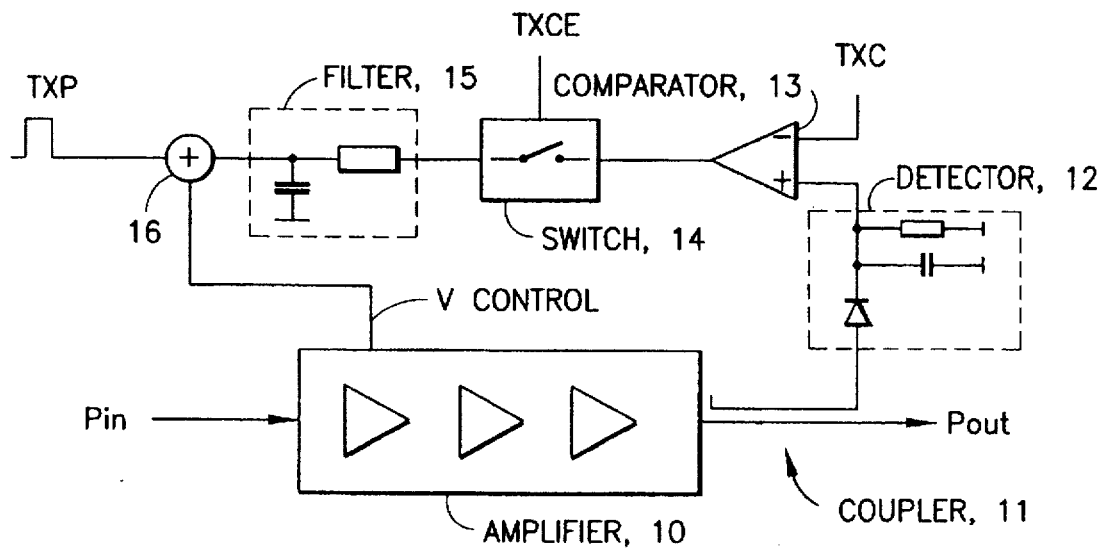
FIG. 1 shows a circuit arrangement according to the first embodiment of the invention for the power control of the transmitter.

FIG. 1 shows the transmitter part of a mobile station with respect to the parts relevant to the description of the invention. A modulated transmission signal is brought to input Pin of power amplifier 10. Output signal Pout of the amplifier is sent to an antenna (not shown). A signal for detector circuit 12 (low pass filtering) is taken from the output signal to the power control loop via directional coupler 11 or the like and from there further to comparator 13. Control signal TXC is the second input of the comparator. The output of comparator 13 is sent via switch 14 and filtering 15 to summing point 16. Switch 14 is controlled by control signal TXCEE. Furthermore, control signal TXP is brought to the summing point, whereupon signal Vcontrol which controls the power amplifier is obtained. In the first embodiment shown in FIG. 1, the power of the transmitter is thus controlled by three separate signals which together form control signal Vcontrol for the power amplifier.

Transmit control signal TXC can be, for instance, a raised cosine signal or any other suitable type of pulse and it is used to control the power envelope shaping and the power level adjustment. The forming of signal TXC according to the invention is described below with reference to FIG. 2. However, signal TXC alone cannot control the whole transmission power ramp up process from the noise level up to the final power level because detector signal 12 does not produce a proper output signal until after a certain threshold value. At outputs below the threshold value, no reasonable input signal is obtained at the comparator input and as a consequence the power raising would be completely uncontrollable without other procedures, in addition, the detector threshold value varies as a function of temperature. On the other hand, the output of the power amplifier varies as a function of the supply voltage. To overcome these problems, transmit power signal TXP is used. Signal TXP is an abrupt step voltage which raises the power to a level where the detector works properly and where the detector is less sensitive to temperature changes.

In accordance with the invention the third control signal is control signal TXCE (transmit control enable) which is always positive in the constant envelope modulation case and at zero during the information transfer in the amplitude modulation case. A positive TXCE switches on switch 14, whereby the power control loop is a closed feedback loop. Therefore, the control logic of the mobile phone must know the respective modulation scheme used to be able to bring signal TXCE into the correct state. This information is obtained from the respective base station, i.e., based on what kind of cellular network cell the respective mobile station is in.

If the cellular system is specified in a way that the modulation schemes and the corresponding bandwidths and, consequently, the bit rates have a one-to-one relationship with each other, the modulation select can be replaced by a bandwidth select, i.e., the modulation mode automatically follows the bandwidth select.

In FIG. 1, control signal Vcontrol is fed directly to the power amplifier. It is also conceivable that the control signal is fed to an adjustable attenuator which is placed between input signal Pin and the actual power amplifier (not shown). In principle, however, such a solution works in the same way as the one shown in FIG. 1.

Figure 2:
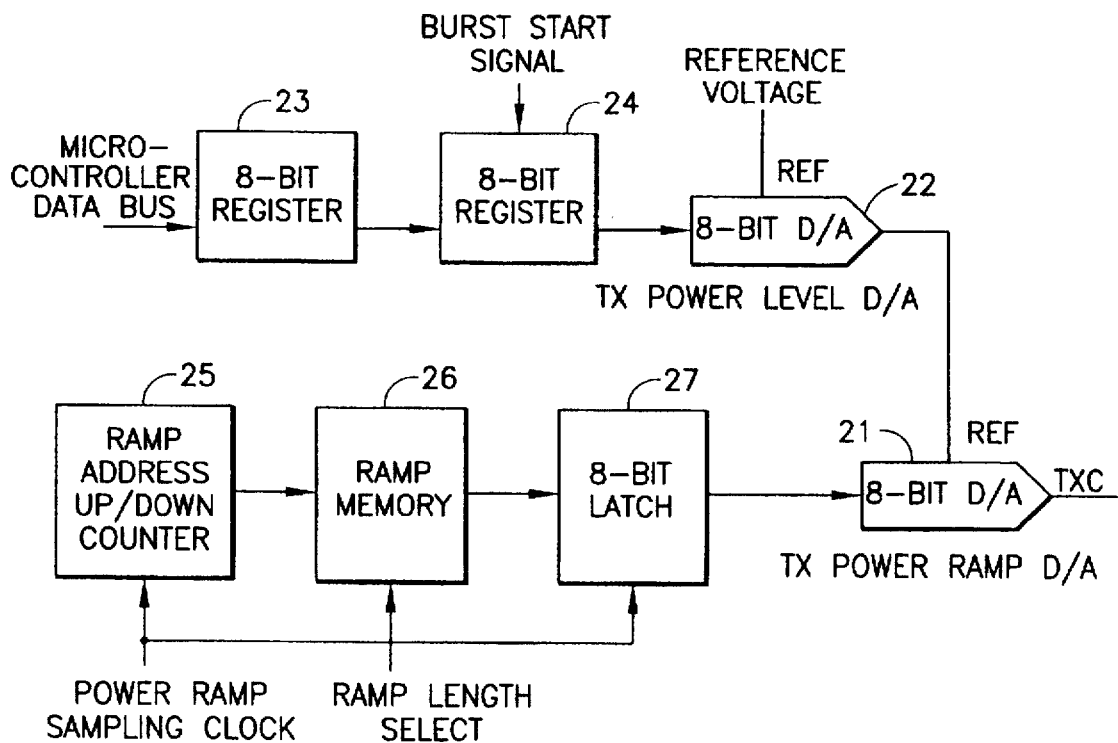
FIG. 2 shows schematically how the power control signal of the transmitter is generated for the circuit arrangement according to FIG. 1.

Referring to FIG. 2, it is examined with the aid of an example how the transmit control signal TXC is formed in the arrangement according to the invention. The transmitter output power can be controlled with two 8-bit digital/analog converters 21 and 22 by using single analog control line (TXC) to the transmitter power control circuit. Naturally, a higher resolution (9 or 10 bits) can also be used in the D/A conversion if necessary. The power level is controlled by an 8-bit control byte allowing a 0.2 dB resolution for 40 dB linear control range.

The TX power level is actually controlled by a signal obtained from the base station of the system, but FIG. 2 only shows the portion included in the mobile station. In this case the power level is controlled by the control logic of the mobile station, i.e., by a signal obtained from it from a microcontroller bus and first stored in an 8-bit register and clocked therefrom to another 8-bit register 24. Register 24 is controlled by a burst start signal, whereby the contents of the register are transferred to converter 22. A reference voltage is coupled to reference input REF of converter 22. The output of D/A converter 22 controlling the power level is conducted to reference input REF of D/A converter 21 which controls the power ramp up.

The power ramp is controlled according to the modulation (or bandwidth) required by the system, using the power ramp sampling clock and ramp length select signals, shown in FIG. 2. A signal which controls the power ramp is obtained from the output of counter 25, memory 26 and latch circuit 27 to D/A converter 21, the output TXC of which is, consequently, an quantized ramp voltage. This ramp voltage is low pass filtered (not shown) before it is transmitted to the TXC input of comparator 13 in FIG. 1. Control bytes for the power ramp up are loaded from ramp duration memory 26 in synchronization with the sampling clock.

Signal TXC can, of course, be formed by another circuit arrangement but it is considered advantageous to use two separate control lines. When the power level and the power ramp are controlled by separate lines, less execution power of the mobile station control logic is required for transmitter power calculation. The burst start signal, power ramp sample clock, and ramp select signal are received from a real-time counter logic. Ramp memory 26 may contain sample data of different ramp lengths. The transmitter power level and power ramp can be changed from burst to burst in accordance with the control of the control logic.

Figure 3:
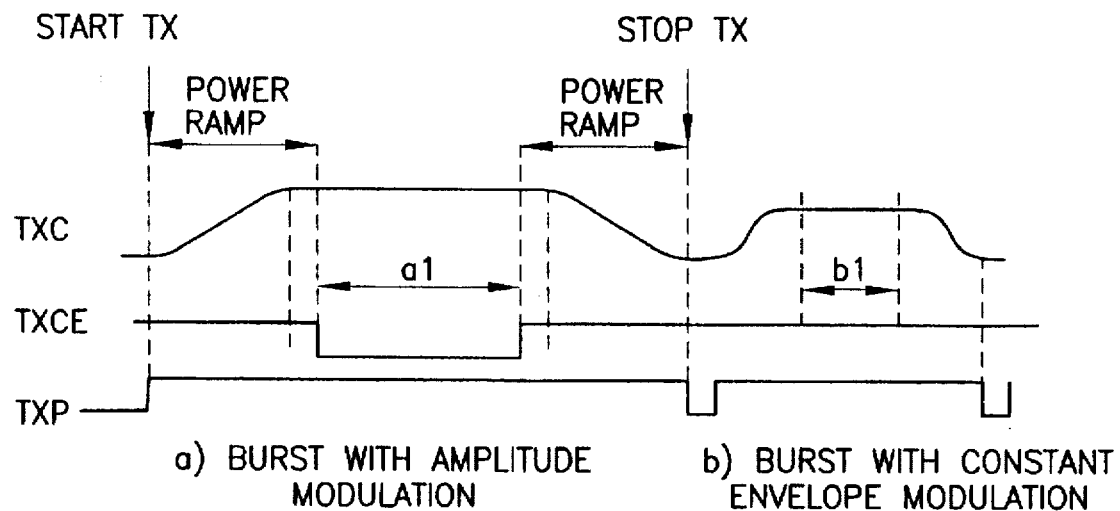
FIG. 3 illustrates behavior in the timing of the signals in FIG. 2.

FIG. 3 illustrates the control signals as a function of time. As already mentioned, the signals are:
TXC=power control analog voltage;
TXCE=control signal of power control loop;
TXP=power on/off.

FIG. 3 shows in phase a) an amplitude modulation burst, end in phase b) a constant envelope modulation burst. In each case, a TXP signal switches the transmission burst on when the signal goes positive, and the burst is ended when the TXP signal returns to the zero revel. This is described, regarding phase a), with markings "start TX", and correspondingly, "stop TX".

The TXC signal is used to control the shape of the power ramp both in the ramp up phase and the ramp down phase, as described above.

According to the invention signal TXCE is used in the amplitude modulation case so that the signal is set to positive and the control loop is on when increasing and decreasing the transmission power during the power ramps, whereby the shape of the transmission power pulse is controllable. Signal TXCE is set to zero in phase a1 for the period of the actual information transfer.

In the constant envelope modulation case, instead, signal TXCE is positive all the time, whereupon the power control loop works all the time, also during the information transfer in phase b1 (FIG. 3).

Figure 4:
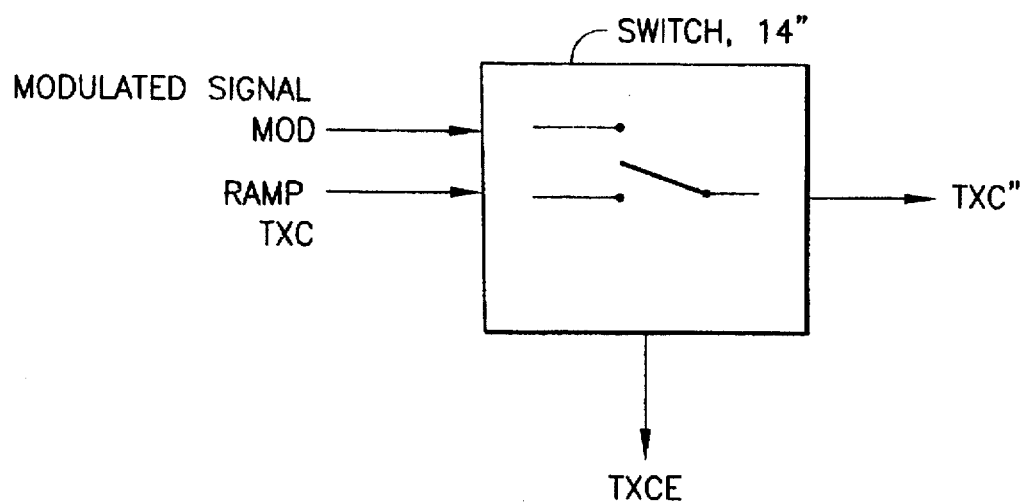
FIG. 4 shows schematically a circuit arrangement according to an alternative embodiment of the invention for controlling the power of the transmitter.

FIG. 4 illustrates schematically a circuit arrangement according to another embodiment of the invention for the transmitter power control. In this alternative, control signal TXCE is used in a slightly different way, i.e., it is used to couple, as the power ramp control signal TXC", either signal TXC which controls the ramp, or modulated signal Mod.

When adapted to the circuit arrangement of FIG. 1, the solution according to FIG. 4 means that switching circuit 14" is placed in the TXC input branch of comparator 13 in FIG. 1. In this case switching circuit 14, of FIG. 1 is omitted. In the alternative of FIG. 4, TXC signal may be formed in the same way as shown in FIG. 2. Modulated control signal Mod can be obtained in different ways: it can be calculated directly from the digital I and Q signals, it may be formed by summing the analog I and Q signals, or It may be obtained by detecting the RF modulator output power. These alternatives are not presented because we assume that the implementation thereof is obvious to those skilled in the art.

When the system uses amplitude modulation and the TXCE signal in FIG. 4 is positive, the ramp signal TXC is selected as the input of switching circuit 14" and it is coupled as output signal TXC", and consequently, the output of power amplifier 10 adheres to the ramp shapes of FIG. 3 because the feedback loop of the amplifier is now controlling the output power.

When the TXCE signal is in zero, modulated signal Mod is selected as the input of switching circuit 14", whereby TXC" signal adheres to modulated signal Mod, and the output of comparator 13 and, consequently, control signal Vcontrol of the power amplifier vary according to the amplitude variations of the modulated signal. Consequently, the output power of amplifier 10 can be controlled during the ramps in the manner presented in FIG. 3 and the modulated signal determines the actual output power during the information transfer.

When the arrangement of FIG. 4 is used by constant envelope modulation, control signal TXCE is always positive, whereby the effect of amplitude variation on the power control can be prevented.

Normally, the control loop bandwidth is smaller than the modulation bandwidth, whereby it is reasonable to use the same filter in the modulated signal input Mod as in the loop itself.

The invention is not limited to the example described herein. Regarding the implementation of the details, many variations are conceivable. Thus the forming of control signal TXC presented in FIG. 2 could be carried out in another way instead of the advantageous manner described herein, for instance, by programming in the microprocessor which controls the mobile station if its capacity for the task is sufficient.

What is claimed is:

1. An output power control for a burst radio transmitter operable in at least two modes, a first mode in which there is no output power variation due to information content of a transmission of said transmitter, and a second mode in which information content of a transmission of said transmitter causes output power variations, said output power control comprising a feedback loop for shaping the envelope of bursts during operation in said first mode and means operable to inhibit shaping the envelope of bursts during operation in said second mode.

2. An output power control for a burst radio transmitter according to claim 1 wherein the means for inhibiting is operable during periods of information transmission.

3. An output power control for a burst radio transmitter according to claim 1 wherein the means for inhibiting comprises means for interrupting said feedback loop.

4. An output power control for a burst radio transmitter according to claim 1 wherein the means for inhibiting comprises means for providing first and second respective signals to said feedback loop.

5. A method for output power control of a pulsed radio transmitter in a radio device, wherein either amplitude modulation or constant envelope modulation is used for transferring information, between the radio device and a base station, based on a control signal obtained from a base station of a radio network, comprising the steps of:

providing a feedback control loop wherein the output power of a transmitter output signal of said transmitter is detected and controlled;

providing a first control signal (TXP), wherein an output transmission pulse of said transmitter of said radio device is switched on and off, said first control signal is electrically introduced into said feedback control loop;

providing a second control signal (TXC") electrically disposed within said feedback control loop, wherein the output power ramp up and down of said output transmission pulse to be transmitted is controlled; and providing a third control signal (TXCE) electrically disposed within said feedback control loop, wherein, during amplitude modulation, transmits a modulated signal (Mod) during information transfer, and which at other times transmits a pulse (TXC), which shapes the power envelope of said output transmission pulse.

6. A method for output power control of a pulsed radio transmitter in a radio device, wherein a modulation mode, either amplitude modulation or constant envelope modulation, is used for transferring information between said radio device and a base station based on a control signal obtained from said base station of a radio network, comprising the steps of:

selecting said modulation mode of said pulsed radio transmitter of said radio device, selection of said modulation mode being based on a control signal obtained from said base station of said radio network;

providing a feedback control loop wherein the output power of a transmitter output signal of said transmitter is detected and controlled;

providing a first control signal (TXP), wherein an output transmission pulse of said transmitter of said radio device is switched on and off, said first control signal electrically introduced into said feedback control loop;

providing a second control signal (TXC) electrically disposed within said feedback control loop, said second control signal is defined by a waveform, wherein the output power envelope shaping of said output transmission pulse to be transmitted is controlled; and providing a third control signal (TXCE) electrically disposed within said feedback control loop, wherein during amplitude modulation information transfer operation, said feedback control loop is disabled.

7. A method according to claim 6, wherein the step of providing a second control signal (TXC) comprises the initial step of forming said waveform of said second control signal according to sample data which are read from a memory (26) of said radio device and which corresponds to transmission modulation conditions of said radio network, said memory stores several sample data sets, whereby the length and ramp up and/or down period of said output transmission pulse, and the shape of said output transmission pulse can be changed from one transmission to another.

8. A method according to claim 6, wherein the step of selecting said modulation mode comprises the initial step of determining an operating bandwidth of a received transmission of said transmitter of said radio device, wherein said modulation mode selection is carried out according to said operating bandwidth of said received transmission received as a control signal from said base station.

9. A method according to claim 6, wherein the step of selecting said modulation mode takes place when said radio device moves from a cell of said radio network which applies said amplitude modulation, into a cell of said radio network which applies said constant envelope modulation, or vica versa.

10. A circuit arrangement for forming a control signal (TXC) wherein said control signal controls the output power envelope shaping of an output pulse to be transmitted by a transmitter of a radio device, said circuit comprising:

control logic, whereby many functions of the radio device are controlled;

a control signal memory (26) having an input and an output, wherein a sample signal is retrieved from said control signal memory upon receiving a select signal as at least part of said input, said select signal is formed by said control logic of said radio device;

a counter circuit (25) electrically communicating with said control signal memory, wherein the output of said counter circuit comprises at least part of an address of said control signal memory;

a latch circuit (27) having an input and an output, said latch circuit input electrically communicates with said output of said control signal memory, said latch circuit temporarily stores said control signal memory data corresponding to said address of said control signal memory;

a sampling clock, said sampling clock electrically communicates with said counter circuit and said latch circuit, wherein said sampling clock increments or decrements said counter circuit and commands said latch circuit to store said control signal memory data in said latch circuit; and a digital/analog converter (21) having a digital input, an analog output corresponding at least partially to said digital input, and a reference signal (REF), whereby the unfiltered said control signal (TXC) is said analog output of said digital/analog converter, said digital input electrically communicates with said output of said latch circuit.

11. A circuit arrangement as in claim 10, wherein said radio device is a mobile station.

12. A circuit arrangement according to claim 10, wherein said reference signal (REF) of said digital/analog converter is a reference signal formed (22, 23, 24) based on a power level signal obtained from a base station of a cellular network.

* * * * *